United States Patent [19]

Sullivan

[11] 4,122,335
[45] Oct. 24, 1978

[54] METHOD AND APPARATUS FOR MASK TO WAFER GAP CONTROL IN X-RAY LITHOGRAPHY

[75] Inventor: Paul A. Sullivan, Santa Monica, Calif.

[73] Assignee: Hughes Aircraft Company, Culver City, Calif.

[21] Appl. No.: 807,707

[22] Filed: Jun. 17, 1977

[51] Int. Cl.² .................... G03B 41/16; G03B 27/02
[52] U.S. Cl. .............................. 250/491; 250/492 A
[58] Field of Search ........................... 250/492 A, 491

[56] References Cited

U.S. PATENT DOCUMENTS

| 3,743,842 | 7/1973 | Smith et al. | 250/492 A |
| 4,085,329 | 4/1978 | McCoy et al. | 250/492 A |

OTHER PUBLICATIONS

McCoy et al, "Mask Alignment for the Fabrication of Integrated Circuits Using X-Ray Lithography," *Solid State Technology*, Sep. 1976, pp. 59–64.

*Primary Examiner*—Alfred E. Smith
*Assistant Examiner*—T. N. Grigsby
*Attorney, Agent, or Firm*—William J. Bethurum; W. H. MacAllister

[57] ABSTRACT

The specification describes a process and apparatus for aligning a mask and semiconductor wafer during X-ray lithography which comprises, among other things, inserting a novel flexible spacer between the mask and wafer so as to maintain a vacuum seal between the mask and wafer. This spacer has a plurality of selectively spaced studs with flat surfaces adapted to receive the mask and wafer in intimate contact and conform to surface variations thereon. This spacer serves to maintain a substantially constant distance between mask and wafer over the entire facing surfaces of these two members during an X-ray lithographic process. A sealing member is disposed at the periphery of the flexible spacer and is also in intimate contact with the mask and wafer so as to maintain a vacuum seal between the mask and wafer. The facing surfaces of the mask and wafer will be forced against the studs on the spacer by atmospheric pressure so long as a vacuum is maintained in the sealed space between the mask and wafer.

6 Claims, 4 Drawing Figures

$\delta = S(d/D)$

METHOD AND APPARATUS FOR MASK TO WAFER GAP CONTROL IN X-RAY LITHOGRAPHY

FIELD OF THE INVENTION

This invention relates generally to micropattern replication processes and more particularly to improved wafer and mask alignment processes and apparatus for use in high resolution x-ray lithography.

BACKGROUND AND RELATED APPLICATIONS

Recently, x-ray lithography has been used in certain semiconductor wafer processing operations to replace the older ultraviolet (UV) photolithographic processes in order to improve the yield and resolution of replicated patterns relative to the yield and resolution achievable with these earlier UV processes. Certain types of these x-ray lithographic processes for mask alignment are described, for example, in copending application Serial No. 682,432 now U.S. Patent No. 4,085,329 and in U.S. Pat. No. 4,019,109, both assigned to the present assignee. These prior disclosures and the references cited therein are incorporated fully herein by reference.

The improved yield which may be realized by the use of x-ray lithography in place of contact UV photolithography results in part from the fact that in x-ray lithography the mask and wafer need not be in direct contact with each other during exposure of the wafer. Thus, this non-contact feature produces higher yields than those produced by direct contact printing techniques. Additionally, there is no loss of resolution for the reason that x-rays do not scatter or diffract as does UV light when a conventional photolithographic mask is physically separated from the semiconductor substrate with which it is aligned. Additionally, short wavelength x-rays pass through dust and low atomic number contamination without the absorption and dispersion that is produced using ultraviolet radiation. Furthermore, the non-contact aspect of x-ray lithographic processes results in a much longer mask life relative to those lithographic processes which require the mask to be in direct contact with the semiconductor wafer.

One disadvantage of using x-ray lithography in place of photolithography is the time required for x-rays to properly expose patterns in resist. In order to reduce this x-ray resist exposure time, consideration has been given to either increasing the power output of the point source of x-rays or moving the x-ray source closer to the wafer on which the resist patterns are developed, or both, since either of these modifications will have the effect of reducing the resist development time. However, by bringing the source of x-rays closer to the wafer being processed, an increased magnification is introduced into the pattern projected from the mask onto the wafer. Such magnification effect is produced when the x-rays pass through off-center areas of the mask at an increasing angle from the normal as the distance between x-ray source and wafer is reduced. This magnification effect can in turn produce intolerable variations in the location of patterns projected onto the wafer surfaces unless the opposing mask and wafer surfaces lie in precisely parallel planes with a uniformly reproducible gap between them. This problem is particularly significant, for example, where the wafer surface is bowed or wavey.

A second undesirable effect of mask-to-wafer spacing variations in x-ray lithography is the penumbral shadow which results when the edge of a feature on the mask is projected onto the wafer with x-rays from a finite size source. This penumbral shadow is a transition region across the edge of a feature where the exposure dose received in the resist gradually changes from full exposure to no exposure. The width of this penumbral shadow is directly proportional to the width of the x-ray source and to the gap between the mask and wafer and is inversely proportional to the distance from the x-ray source to the mask. Variations in the mask-to-wafer gap produce variations in the width of this penumbral shadow, and this results in undesirable variations in the size of features produced in the x-ray resist when it is developed.

Thus, as will become more readily apparent herein, a constant distance between mask and wafer across the entire facing surfaces of both of these members is manifestly desirable in order to achieve minimum distortion in the replicated micropattern and a minimum of undesirable variations in the resist patterns being developed.

In U.S. Pat. No. 3,743,842 issued to Henry I. Smith et al there is shown one method for providing a separation between mask and wafer during an x-ray lithographic process. This method utilizes an annular spacer which may be a part of the x-ray absorption mask through which the x-rays pass to reach the semiconductor wafer. However, the spacing techniques disclosed in U.S. Pat. No. 3,743,842 do not alleviate the problem of variable distances between mask and wafer throughout their surface areas, such as in situations described above where the wafer is wavey or bowed or both. It is the solution to this problem to which the present invention is directed.

In the IEEE Transactions on Electronic Devices, Volume ED-22, No. 7, July 1975 at page 421, Bernacki and Smith propose the use of studs on a photoresist mask to control the mask-to-substrate gap by forcing the wafer substrate into contact with the studs on the mask. These studs would be located within the kerf that separates individual microelectronic circuit patterns on the mask, and these studs might be 10 microns high and 25 microns in diameter, for example, and located at the corners of the individual microelectronic circuit patterns on the mask. That is, they would be located in a square array with a spacing of typically 1 to 10 millimeters. Additionally, the small studs proposed by Bernacki and Smith were to be located at the corners of the photoresist mask instead of ribs running along the kerf lines thereof, the reason being that this latter proposed configuration provides a smaller contact area and consequently a low probabililty that a stud would come to rest upon a dust particle or other defect. However, a significant disadvantage of this Bernacki and Smith approach will likely be encountered in actual practice when the studs begin to pick up resist from the substrate, and consequently the photoresist mask will require frequent cleaning, which may produce defects on the mask.

THE INVENTION

Accordingly, the general purpose of this invention is to provide an improved wafer and mask alignment process for use in x-ray lithography which provides a substantially constant distance between mask and wafer throughout all areas of their respective surfaces. To accomplish this purpose, I have developed a novel continous horizontal flexible spacer member having a plurality of vertical spacing studs extending normal from both horizontal parallel surfaces thereof and adapted to receive a mask and wafer during an x-ray lithographic process. The flexible spacer member further includes an annular seal member at its outer periphery which is adapted to receive the mask and wafer in intimate contact during a resist exposure processing operation. A differential pressure is created at opposite surfaces of the wafer and is sufficient to urge the wafer and spacer against the x-ray absorption mask and maintain the wafer in a fixed position during the x-ray exposure of resist on the surface of the wafer. Thus, the vertical spacing studs provide a substantially constant distance between the mask and wafer during an x-ray lithogaphic process, and the outer seal member of the spacer insures that a differential pressure is maintained at opposite surfaces of the wafer throughout a wafer processing operation. Not only can this continuous flexible spacer member be repeatedly cleaned and used in successive x-ray lithographic operations, but very little waste is involved when the spacer is finally discarded, since it is separate and distinct from the x-ray absorption mask used for micropattern replication.

Therefore, it is an object of the present invention to provide a new and improved mask alignment process and apparatus for use in x-ray lithography.

Another object is to provide a process and apparatus of the type described which serves to improve pattern definition and line width uniformity in x-ray lithography.

Another object is to provide a process and apparatus of the type described which serves to minimize the time required for exposing resist patterns by the use of x-ray sources.

Another object is to provide a process and apparatus of the type described which minimizes pattern variations produced in part by magnification effects when x-rays are projected at an angle onto a layer of resist.

Another object is to provide a process and apparatus of the type described which are readily adaptable for use with certain existing x-ray lithographic equipment.

A feature of the invention is the provision of a unique flexible spacer member adapted for use in x-ray lithography and which is economical in construction and reliable in performance.

These and other objects and features of the invention will become more readily apparent in the following description of the accompanying drawings.

DRAWINGS

DESCRIPTION OF THE PREFERRED EMBODIMENTS

Figure 1:
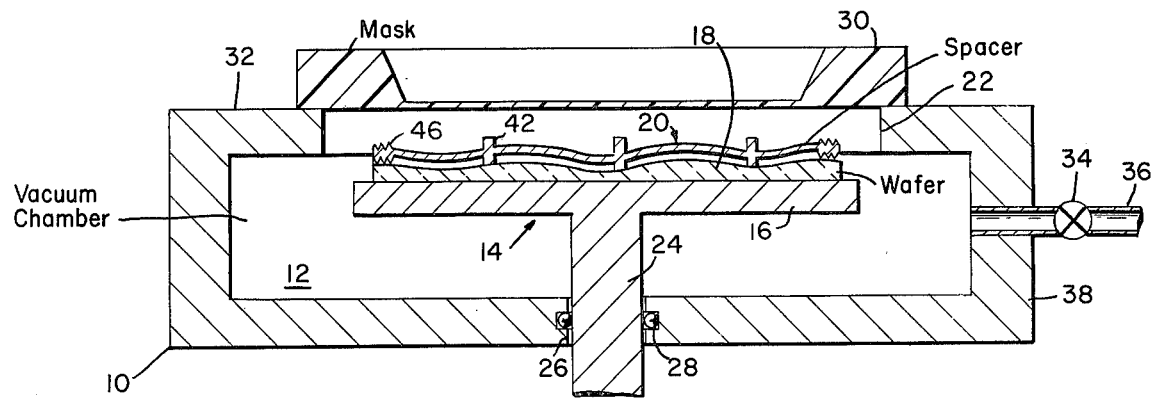
FIG. 1 is a schematic diagram of one x-ray lithographic system embodiment of my invention, including a vacuum chamber for bringing the wafer, mask and spacer together.

Referring now to FIG. 1, there is shown a mask support housing 10 having a vacuum chamber 12 therein for receiving a substrate (wafer) support table 14 in a central location thereof. The table 14 includes a flat horizontal top portion 16 upon which a wafer 18 and spacer 20 are mounted as shown prior to inserting the table, wafer and spacer into the chamber 12 via opening 22. The table 14 further includes a vertical stem member 24 which extends as shown through another opening 26 in the housing 10 and there engages an O-ring seal 28 which allows vertical movement of the table 14 within the vacuum chamber 12. Means may also be provided at the seal 28 for horizontally positioning the table 14. For simplicity, the horizontal wafer alignment mechanism is not illustrated, but it may be any of the several types known in the art without departing from the spirit of this invention.

After the table 14, wafer 18 and spacer 20 thereon have been inserted in the vacuum chamber 12 in the position shown in FIG. 1, an x-ray absorbing mask 30 is positioned as shown on the upper surface 32 of the housing 10 and is there aligned with the wafer 18 using conventional mask alignment techniques. With the table 14 and the mask 30 in the position shown in FIG. 1, the chamber 12 is evacuated by means of a vacuum pump (not shown) which is connected to the chamber 12 through a conventional vacuum valve 34. The vacuum valve 34 is disposed as shown in a vacuum pump line 36 which extends through one wall 38 of the housing 10 and into the vacuum chamber 12. In another embodiment of the invention, the region between the mask 30 and wafer 18 may be evacuated through a port at the periphery of table surface 16, and a vacuum pump line internal to the vertical stem 26 may be used for this purpose. Such alternative embodiment is, of course, not shown in the drawing. After mask-to-wafer alignment is accomplished with members 18 & 20, the valve 34 is then opened to produce an evacuated condition on the order of about 100 Torr or less within the chamber 12. The forces produced by the evacuated condition within the chamber 12 cause the table 14 and the mask 30 to be urged toward one another, with the resultant effect being that the table stem 24 moves upwardly into a forced intimate contact with the mask 30. During this movement, the table stem 24 rolls or slides on the seal member 28 which may be a part of a horizontal alignment mechanism mounted in the housing 10.

After the wafer 18 and the spacer 20 are brought into contact with the mask 30 and the region between these two members has been evacuated, then the peripheral seal 46 of the spacer 20 will provide a vacuum seal at the periphery of members 18 & 20 and the evacuated condition in chamber 12 may be removed. The vacuum seal 46 will maintain the evacuated condition between the wafer 18 and the mask 30 so that the atmospheric pressure on the outer surfaces of the mask 30 and the wafer 18 will force their inner, facing surfaces into intimate contact with the vertical studs 42 or 56 on the spacer 20.

Figure 3:
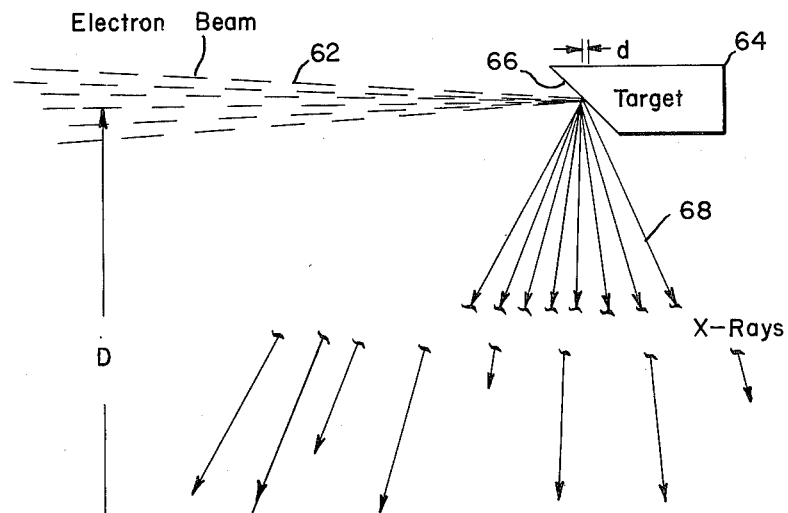
FIG. 3 is an enlarged cross-section view of the wafer, mask and spacer of FIG. 1, and taken along lines 3—3 of FIG. 2.
Figure 2:
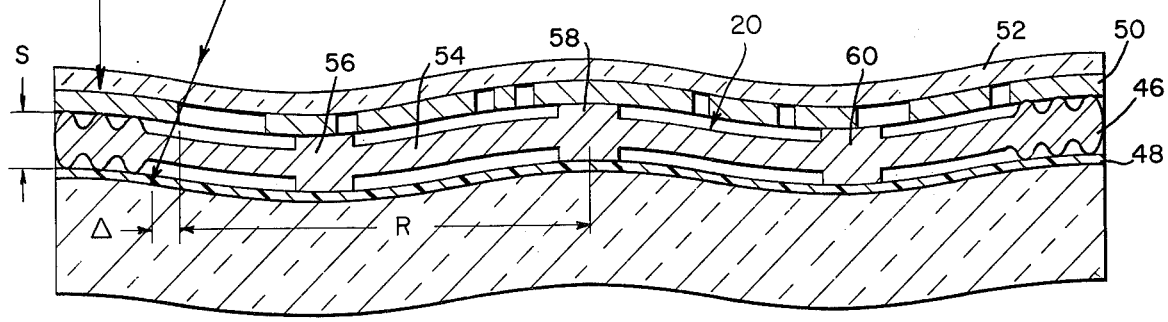
FIG. 2 is a plan view of the spacer of FIG. 1.
Figure 2:
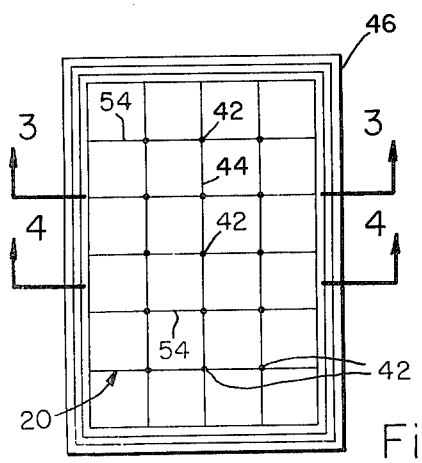

Referring now to FIGS. 2 and 3, FIG. 2 is a plan view of the spacer 20 of FIG. 1 and constitutes a "studded mesh" having a plurality of vertical studs 42 which are located at the intersections of the mesh wires 44 which in turn complete the mesh and extend to an outer rib-like flexible seal member 46. One technique for fabricating such a studded mesh is described in some detail in a later portion of the specification. However, it is preferred that the thickness dimension of the orthogonal horizontal wires 44 of the mesh be substantially thinner than the vertical stud members 42 which are integral with the mesh wires 44 at their respective intersections. These stud members 42 make intimate contact, as shown in FIG. 3, with the respective surfaces of a thin x-ray resist film 48 on the wafer 18 and an x-ray absorption pattern 50 which is disposed on the continuous x-ray transparent mask member 52. Thus, the flexible spacer 20 in FIG. 3 includes a continuous horizontal, relatively flat member 54 which extends between a continuous outer seal member 46 and includes a plurality of vertical studs 56, 58 and 60 integral therewith. Since the opposing surfaces of the resist film 48 and the x-ray absorption pattern 50 contact the opposed flat surfaces of the vertical studs 56, 58 and 60 in the studded mesh, the continuous flat portion 54 of the mesh is not forced into contact with either the resist film 48 or the x-ray absorption pattern 50. This feature is particularly significant from the standpoint of minimizing damage to both the resist film 48 and the pattern 50, as well as the flexible spacer 20, while simultaneously maintaining a substantially constant mask-to-wafer gap, S, at all points throughout the opposing surfaces of the film 48 and x-ray absorption pattern 50 during an x-ray exposure process.

The x-ray generation process utilized in practicing the present invention has been previously described in some detail in the above-identified Bernacki and Smith IEEE publication. This process involves the use of an electron beam 62 to bombard an x-ray target member 64 having a slanted surface 66 thereon for receiving a stream of electrons. These electrons produce x-rays 68 which are projected from the target 64 and are emitted over a horizontal distance, d, thereon, and these excited x-rays 68 are projected in the pattern shown onto the x-ray absorption mask 30. The generation of x-rays is also described in my copending application Ser. No. 682,432 now U.S. Pat. No. 4,085,329 and in my U.S. Pat. No. 4,019,109 and is, therefore, not described in further detail herein.

Figure 4:
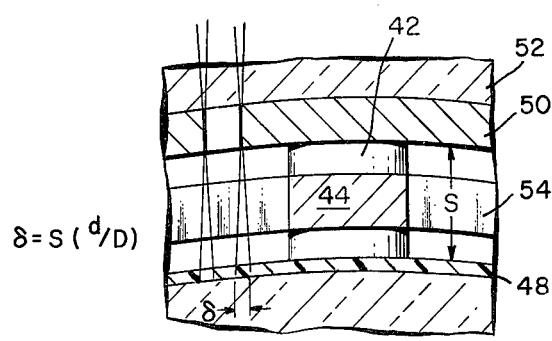
FIG. 4 is an enlarged view of one region of FIG. 3, taken along lines 4—4 of FIG. 2 and illustrating the projection of x-rays through a mask and onto a layer of resist.

In order to appreciate the desirability and criticallity of providing a substantially constant mask-to-wafer spacing, S, continuously across the opposing surfaces of the resist film 48 and the electron beam absorption pattern 50, reference should now be made to the enlarged fragmented cross-sectional view of FIG. 4. This view illustrates the x-ray's penumberal shadow, δ, as a function of the mask-to-substrate gap, S, the width, d, of the x-ray source at the target 64 and the distance D between the x-ray target and the upper surface of the x-ray absorption mask 50. This shadow may be defined as $$\delta = Sd/D \qquad \text{Eq. (1)}$$

In order to reduce the x-ray exposure times using a system and method of the type described herein, one approach has been to decrease the mask-to-source distance D in Equation (Eq.) 1 above using, for example, a 10 kilowatt x-ray generator and moving it closer to the resist covered wafer. But one effect of decreasing the distance D is to increase the width of the penumbral shadow, δ, defined in the above Equation 1. This produces a corresponding decrease in the resolution of the x-ray lithography process unless the gap S can be uniformly controlled to a small value.

Because the image from the x-ray absorption mask is projected onto the resist covered substrate from a point source (approximately) there is a magnification effect in this x-ray replication process. That is, a feature at one edge of an x-ray absorption pattern will be displaced on the resist layer by an amount Δ which is termed geometric distortion and is defined as:

$$\Delta = SR/D \qquad \text{Eq. (2)}$$

where R is the radius of the x-ray absorption mask (illustrated in FIG. 3). In the fabrication of microelectronic circuits where several masks are projected onto a substrate at various times during a processing sequence and where patterns must overlay each other perfectly, this perfect mask-to-mask alignment can occur only if S is exactly reproduced for each succeeding mask level. If there is a variation in the gap such as to change the gap width by an amount, S', then there will be a corresponding uncontrolled geometric distortion as given by the relation:

$$\Delta' = S'R/D \qquad \text{Eq. (3)}$$

Thus, in order to minimize the resolution degrading effects caused by δ and Δ', it is desirable to make S and S' as small as possible. On the other hand, in order to insure reasonably high wafer processing yields, there should be no contact between the mask and the semiconductor substrate, since dust particles on the mask or substrate, for example, can produce defects in pattern definition if the spacing, S, is less than about 10 micrometers. Additionally, if the substrate is an epitaxial silicon wafer, it may contain epitaxial spikes which can extend up to 10 micrometers above the epitaxial layer surface and thus can seriously damage an x-ray absorption mask. Therefore, there is no advantage in making S less than 10 micrometers. Also, since there is no advantage in making Δ' much less than δ, Equations 1 and 3 above can be set equal as follows:

$$S' \simeq Sd/R \qquad \text{Eq. (4)}$$

Furthermore, since there is no advantage in making S' much less than the value given by Equation 4, a typical value of S' will be approximately equal to $0.1S$; that is, $S' \approx 0.1S$.

It is very difficult to achieve these close spacings between the x-ray absorption mask and substrate, and this is because a two-inch diameter silicon wafer, for example, has a typical specification for both taper and flatness of approximately 10 micrometers. Thus, in accordance with the present invention, it is preferred that the constant mask-to-wafer spacing, S, be a chosen value between 20 and 30 micrometers in order to yield a magnification of not more than about 0.01%. The above-described novel studded mesh spacer enables these results to be achieved while simultaneously providing a spacer which may be easily cleaned and used over and over again in such a way as to minimize damage to both the x-ray absorption mask and the resist layers with which it comes into contact.

The studded mesh spacer shown in FIG. 2 may be fabricated using standard photochemical etching processes. Using such processes, square openings are initially etched completely through a 5 to 50 micrometer thick sheet of metal foil, preferably from both sides thereof using standard photochemical etching techniques. Next, a second coating of photoresist can be applied to each side of the etched foil and exposed and developed to leave photo resist covering the intersections of the remaining ribs of foil and its outer periphery. Etching should again be performed on both sides of the remaining exposed metal foil to further thin the ribs down to about one-half of their original thickness, while leaving the thicker resist-protected studs intact. The thickness uniformity of the individual studs will be as good as the thickness uniformity of the original foil, and the rib thickness is not critical. However, etching must obviously be terminated before reaching completely through these metal ribs.

When the system of FIG. 1 above is used with a mask alignment system, the studded mesh of FIG. 3 will be placed on the semiconductor wafer in order to align with kerf lines thereon using automated handling techniques. Alignment accuracies of typically ±25 microns are achievable using such techniques. Next, the wafer will be brought into contact with the x-ray absorption mask while maintaining proper alignment of the mask and wafer through either the use of operator control or by using an automatic precision mask alignment system. Such system will dynamically lock-in on the aligned position, while maintaining a small peak-to-peak dither of approximately 0.1 micrometer as the mask-to-wafer gap S is closed. Such a precision alignment system is described, for example, in my U.S. Pat. No. 4,019,109 and my copending application Ser. No. 682,432 now U.S. Pat. No. 4,085,329.

Various modifications may be made to the above-described embodiments of my invention without departing from the true scope thereof. For example, various types of vacuum apparatus and mechanical support and clamping means may be utilized for bringing the mask, wafer and spacer into intimate contact, one with another, without being restricted to the use of the particular apparatus shown in FIG. 1 above. Similarly, the exact geometrical configuration of the thin flexible spacer is not limited to a symmetrical studded mesh as shown in FIG. 2, and may instead assume various asymmetrical configurations which may be required in certain types of device fabrication operations.

What is claimed is:

1. A flexible spacer for maintaining a constant distance between a mask and wafer which comprises a continuous flat flexible member including an elongated main body having parallel major surfaces and a plurality of selectively spaced vertical studs extending normal thereto, said vertical studs having flat exterior end surfaces for engaging said mask and wafer, respectively, and said spacer further including a seal member at the outer periphery of said elongated main body and also adapted to engage said mask and wafer in intimate contact for maintaining a desired differential pressure at opposing surfaces of said wafer, whereby said elongated main body, studs and seal portion thereof conform to surface variations of said mask and wafer, respectively, and serve to maintain a substantially constant distance therebetween.

2. A flexible spacer as defined in claim 1 wherein said vertical studs are interconnected by a flat mesh having thin members thereof with a vertical thickness less than the vertical height of said studs, whereby only the ends of the studs contact said mask and wafer respectively when said mask and wafer are urged against each other.

3. A process for aligning a mask and a wafer which comprises:
   (a) inserting a flexible spacer between said mask and wafer and having a plurality of studs thereon extending substantially normal to said mask and wafer for receiving same in intimate contact at predetermined locations;
   (b) aligning a pattern on said mask with chosen areas on said wafer to be developed;
   (c) bringing said mask, wafer and spacer into contact with one another while maintaining an evacuated condition on both sides of said wafer; and
   (d) removing the evacuated condition from one side of said wafer, whereby the differential pressure created on opposite sides of the wafer urges said wafer and spacer against said mask to tend to make the mask surface conform to the facing wafer surface, maintains a constant distance between said mask and wafer and thereby improves the resolution of resist patterns replicated thereon.

4. The process defined in claim 3 which includes providing a spacer in the form of a thin flexible studded mesh between said mask and wafer, which mesh includes selectively spaced studs for engaging said mask and wafer and which conforms to surface variations on said mask and wafer to maintain said constant distance therebetween.

5. The process defined in claim 3 which includes aligning an x-ray absorber pattern on said mask with said wafer and projecting x-rays through openings in said mask and onto a resist layer on said wafer, whereby the constant distance provided between said mask and wafer enables the distance between said mask and a source of x-rays to be minimized to in turn reduce the time required for exposing said resist layer.

6. The process defined in claim 5 which includes providing a spacer in the form of a thin flexible studded mesh between said mask and wafer, which mesh includes selectively spaced studs for engaging said mask and wafer and which conforms to surface variations on said mask and wafer to maintain said constant distance therebetween.

* * * * *